(12) United States Patent
Hughes et al.

(10) Patent No.: US 8,580,075 B2
(45) Date of Patent: Nov. 12, 2013

(54) METHOD AND SYSTEM FOR INTRODUCTION OF AN ACTIVE MATERIAL TO A CHEMICAL PROCESS

(75) Inventors: John A. Hughes, Falls Church, VA (US); Sandra Hyland, Falls Church, VA (US); Ralph Kim, Beverly, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/451,685

(22) Filed: Apr. 20, 2012

(65) Prior Publication Data

US 2012/0199288 A1 Aug. 9, 2012

Related U.S. Application Data

(62) Division of application No. 10/673,376, filed on Sep. 30, 2003, now abandoned.

(51) Int. Cl.
*C23F 1/00* (2006.01)
*H01L 21/306* (2006.01)
*C23C 16/00* (2006.01)

(52) U.S. Cl.
USPC .................. 156/345.1; 118/715; 118/723 R

(58) Field of Classification Search
USPC .................. 118/715, 722, 723 R; 156/345.1
See application file for complete search history.

(56) References Cited

U.S. PATENT DOCUMENTS

| | | | |
|---|---|---|---|
| 4,997,862 A * | 3/1991 | Lark | 523/210 |
| 5,059,292 A | 10/1991 | Collins et al. | |
| 5,187,542 A | 2/1993 | Madzsar | |
| 5,447,616 A | 9/1995 | Satou et al. | |
| 5,467,013 A * | 11/1995 | Williams et al. | 324/127 |
| 5,474,649 A | 12/1995 | Kava et al. | |
| 5,556,500 A | 9/1996 | Hasegawa et al. | |
| 5,888,337 A * | 3/1999 | Saito | 156/345.25 |
| 5,904,778 A | 5/1999 | Lu et al. | |
| 5,947,053 A | 9/1999 | Burnham et al. | |
| 6,019,000 A * | 2/2000 | Stanke et al. | 73/622 |
| 6,071,573 A | 6/2000 | Koemtzopoulos et al. | |
| 6,367,412 B1 | 4/2002 | Ramaswamy et al. | |
| 6,436,426 B1 * | 8/2002 | Liao et al. | 424/426 |
| 6,464,843 B1 | 10/2002 | Wicker et al. | |
| 7,227,097 B2 | 6/2007 | Kumar et al. | |

* cited by examiner

*Primary Examiner* — Maureen Gramaglia
(74) *Attorney, Agent, or Firm* — Oblon, Spivak, McClelland, Maier & Neustadt, L.L.P.

(57) ABSTRACT

A method and system of for introducing an active material to a chemical process in which a processing element including a passive component and an active element is installed within the system and exposed to a chemical process performed within the system. As the chemical process proceeds, the passive component erodes and thereby exposes the active component embedded therein. The introduction of the active component to the chemical process alters the chemical process.

25 Claims, 9 Drawing Sheets

METHOD AND SYSTEM FOR INTRODUCTION OF AN ACTIVE MATERIAL TO A CHEMICAL PROCESS

CROSS-REFERENCE TO RELATED APPLICATIONS

The present application is a divisional of U.S. application Ser. No. 10/673,376, filed on Sep. 30, 2003 now abandoned, the entire content of which is incorporated herein by reference.

BACKGROUND OF THE INVENTION

1. Field of the Invention

The present invention relates to a method and system for introducing an active material to a chemical process, and, more particularly, to a method and system for the introduction of the active material in order to tailor the chemical process for optimal performance.

2. Description of the Related Art

The fabrication of integrated circuits (IC) in the semiconductor industry typically employs plasmas to create and assist surface chemistry within a plasma reactor to remove material from and deposit material to a substrate. In general, plasmas are formed within the plasma reactor under vacuum conditions by heating electrons to energies sufficient to sustain ionizing collisions with a supplied process gas. Moreover, the heated electrons can have energy sufficient to sustain dissociative collisions. Therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate). While it is known that certain materials introduced into the processing chamber during the plasma process can affect or enhance the process performed in the chamber, the mechanisms for delivery of such materials into the process chamber are complex and expensive.

Although the formation of a population of charged species (ions, etc.) and chemically reactive species is necessary for performing the function of the plasma processing system (i.e., material etch, material deposition, etc.) at the substrate surface, other component surfaces on the interior of the processing chamber are exposed to the physically and chemically active plasma environment and, in time, can erode. The uncontrolled erosion of exposed components in the plasma processing system can lead to a gradual degradation of the plasma processing performance, can contribute contamination to the plasma processing, and, in general, is such that erosion of these components affects specific processes in the plasma processing system. Thus, the semiconductor industry has primarily focused on monitoring and controlling the erosion of exposed components in a plasma processing system.

SUMMARY OF THE INVENTION

One object of the present invention is to provide a method and system for introducing an active material into a chemical process in a semiconductor manufacturing process.

Another object of the present invention is to utilize the erosion of exposed components in a processing chamber to improve a process performed in the chamber.

Yet another object of the present invention is to utilize controlled erosion of exposed components in a processing chamber to introduce an active material into the semiconductor manufacturing process.

Accordingly, in one aspect of the present invention a processing element is configured to affect a chemical process in a semiconductor manufacturing system. The processing element including a passive component configured to be coupled to a semiconductor manufacturing system and configured to erode when exposed to a chemical process in the semiconductor manufacturing system. The processing element includes an active component coupled to the passive component and configured to alter the chemistry of the chemical process when the active component is exposed to the chemical process.

In another aspect of the present invention, a semiconductor manufacturing system for processing a substrate using a chemical process includes a processing chamber configured to facilitate the chemical process, a substrate holder coupled to the processing chamber and configured to support the substrate; a gas distribution system coupled to the processing chamber and configured to introduce a process gas to the processing chamber; a plasma source coupled to the processing chamber and configured to generate a plasma in the processing chamber, and at least one processing element coupled to at least one of the processing chamber, the substrate holder, the gas distribution system, and the plasma source. The at least one processing element includes a passive component configured to erode when exposed to the chemical process in the semiconductor manufacturing system, and includes an active component coupled to the passive component and configured to alter the chemistry of the chemical process when the active component is exposed to the chemical process.

In another aspect of the present invention, a method of utilizing a processing element to affect a chemical process in a semiconductor manufacturing system includes installing in a semiconductor manufacturing system at least one processing element, including a passive component configured to be coupled to the semiconductor manufacturing system and including an active component coupled to the passive component, exposing the at least one processing element to the chemical process in order to facilitate erosion of the passive element, and introducing the active component during the erosion of the passive component in order to alter the chemistry of the chemical process when the active component is exposed to the chemical process.

In a further aspect of the present invention, the method monitors the erosion of the yet passive component.

In still a further aspect of the present invention, the method controls the introduction of the active component by (1) varying a distribution of at least one of a size, composition, and a concentration of the active component in the passive component, (2) varying the temperature of the passive component, or (3) tailoring a geometry of the passive component.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF EXEMPLARY EMBODIMENTS

As noted in the Description of Related Art section above, existing mechanisms for delivery of process affecting materials into a plasma process chamber are complex and expensive. For example, while some solid materials may be used to enhance a chemical process performed in a processing chamber, there is currently no tested mechanism for delivery of the solid material into the process chamber during the chemical process. Moreover, the introduction of a process affecting liquid materials into a semiconductor manufacturing system is a generally a tenuous process. A liquid material introduced to the chamber will frequently condensed on walls below a temperature at which the liquid will vaporize, resulting in an extended "memory effect" on the semiconductor manufacturing process. Further, in vacuum processing systems, evaporation of the condensed liquid cools the liquid resulting in at best a reduced evaporation rate and at worse the liquid being frozen into a solid phase. Finally, vacuum processing pumps do not typically handle pumping large quantities of liquid with some degradation. Thus, traditional processes for injecting liquids or injecting a pre-vaporized liquids into a semiconductor manufacturing system, especially a vacuum processing system, do not provide a controlled mechanism for reliably providing the liquid material.

Although the erosion of exposed components in a chemical processing system has generally been perceived by the semiconductor manufacturing industry as a problem to be controlled, the present inventors have discovered that controlled erosion of chamber components can be used as a mechanism for delivery of process affecting materials into the process chamber. In particular, one embodiment of the present invention incorporates a liquid as an active material in an inert matrix as the passive material as part of a chamber component such that the active material be released upon exposure and erosion of the chamber component by a chemical process (e.g., a plasma process). This embodiment of the invention provides the active material in a controlled fashion at a point of use and consumption where it will impact the chemical process and be less likely to negatively affect the semiconductor processing system.

Figure 1:
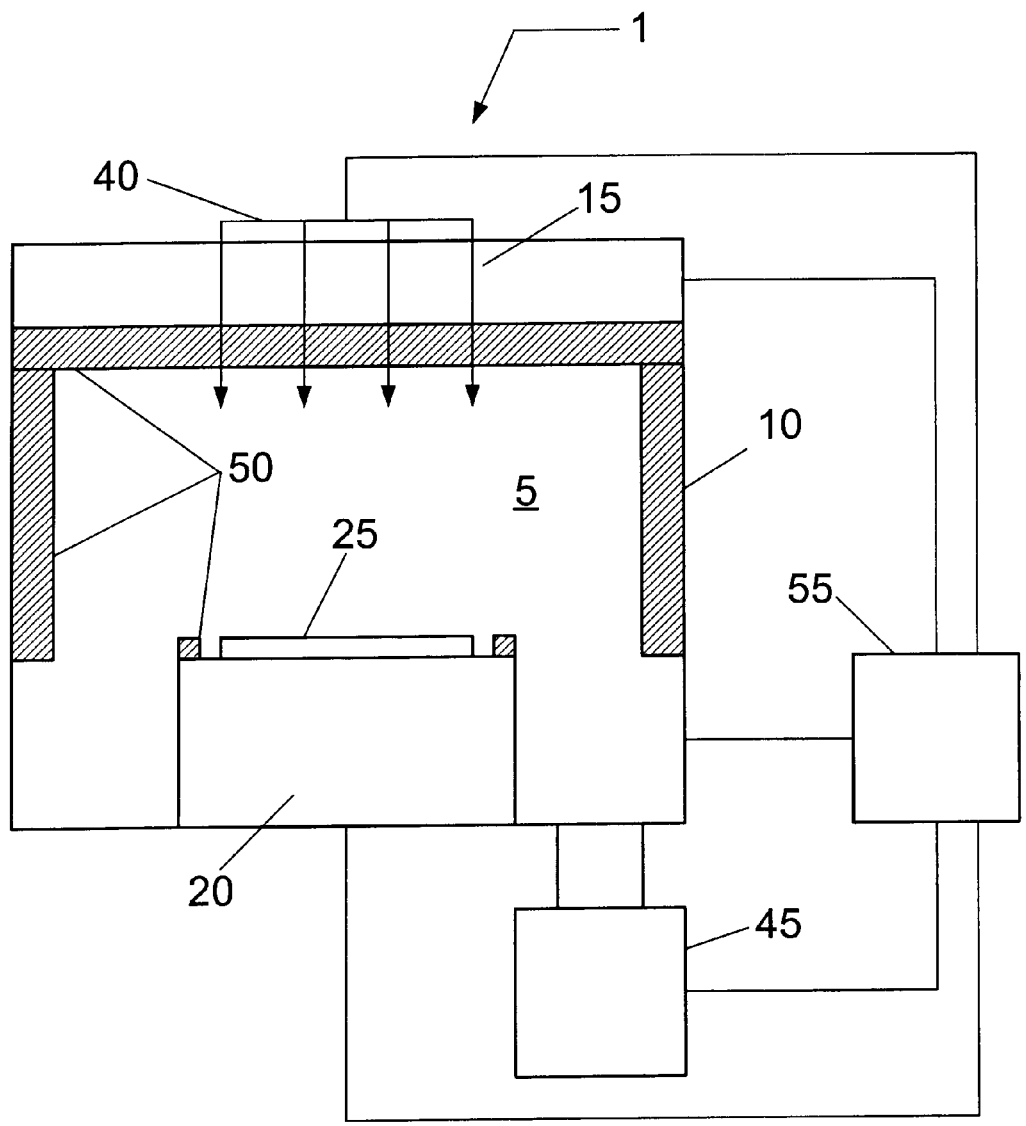
FIG. 1 is a schematic depicting a semiconductor manufacturing system according to a preferred embodiment of the present invention.

Referring now to the drawings, wherein like reference numerals designate identical, or corresponding parts throughout the several views, and more particularly to FIG. 1, a semiconductor manufacturing system 1 is depicted in FIG. 1 including a processing chamber 10, a plasma source 15 coupled to the processing chamber 10 and configured to generate a plasma in a processing region 5 in the processing chamber 10, a substrate holder 20 coupled to the processing chamber 10 and configured to support a substrate 25, a process gas distribution system 40 coupled to the processing chamber 10 and configured to introduce process gas to processing region 5, and a pumping system 45 coupled to the processing chamber 10 and configured to alter the pressure of processing region 5 in processing chamber 10. For example, processing chamber 10 can facilitate processing substrate 25 at an elevated pressure, at atmospheric pressure, or at a reduced (vacuum) pressure. Moreover, for example, processing chamber 10 can facilitate the use of a plasma to perform a dry plasma etch process, wherein a pattern formed in a mask layer (such as a pattern formed in a light-sensitive layer using micro-lithography) is transferred to an underlying film on substrate 25. The semiconductor manufacturing system 1 can be configured to process various substrates (e.g., 100 mm, 125 mm, 150 mm, 200 mm, 300 mm diameter substrates, or larger).

Referring again to FIG. 1, the semiconductor manufacturing system 1 further includes one or more processing elements 50 coupled to the processing chamber 10. Additionally, the one or more processing elements 50 includes one or more exposed surfaces that are exposed to or are in contact with a chemical process in processing region 5. The one or more processing elements 50 can, for example, constitute a process unit that can be periodically replaced wholly, or part-by-part. At least one of the one or more processing elements 50 includes a passive component and at least one active component. The active component is configured to affect a change in the chemistry upon exposure to the chemical process. For example, the active component can provide at least one of reaction promotion, reaction inhibition, creation of a protective skin on a feature, polymer strengthening, and polymer weakening. Any one of the above provisions can affect the etching profile control during, for example, dry plasma etching of a feature in substrate 25.

Figure 2:
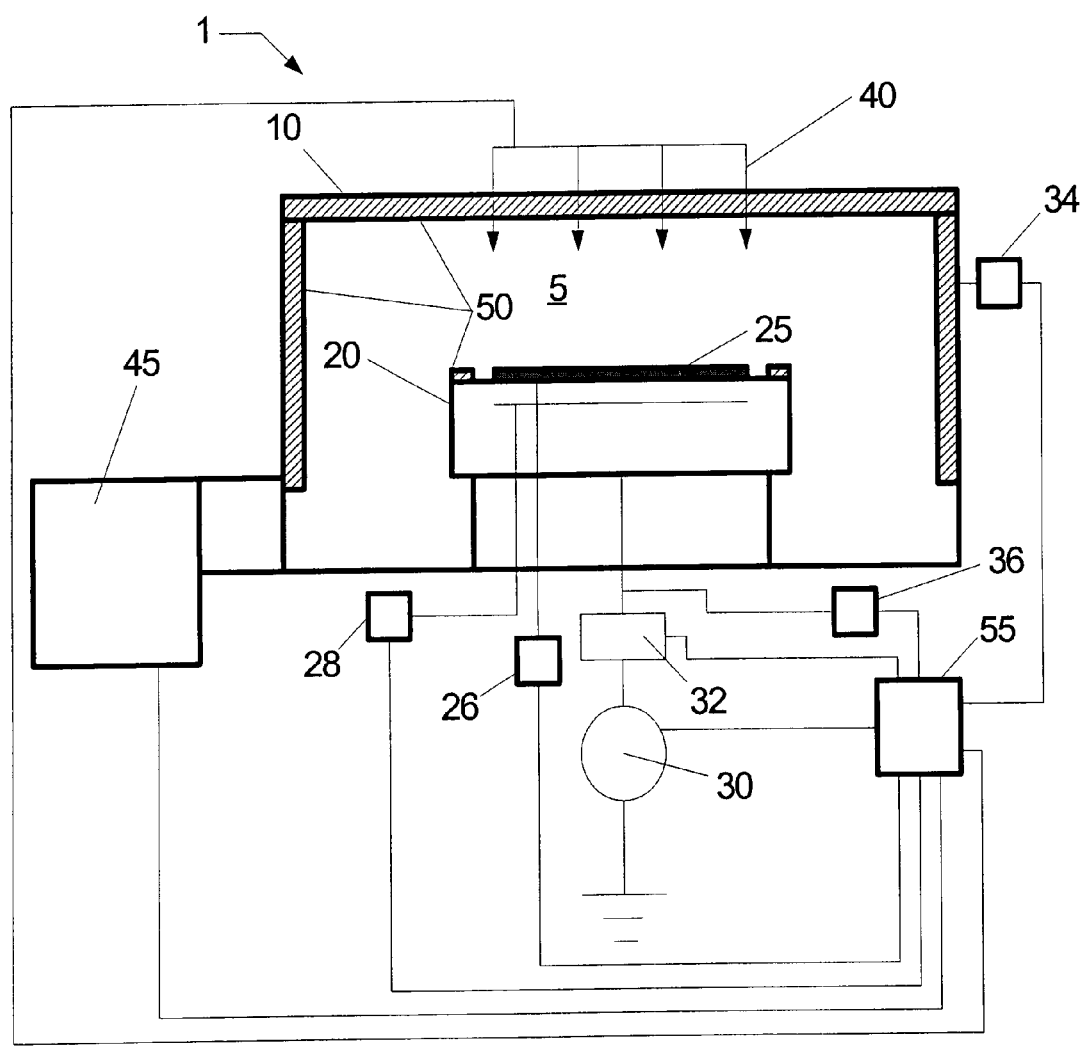
FIG. 2 is a schematic depicting a semiconductor manufacturing system according to one embodiment of the present invention.

According to the illustrated embodiment of the present invention depicted in FIG. 2, the semiconductor manufacturing system 1 includes processing chamber 10, substrate holder 20, upon which a substrate 25 to be processed is affixed, gas injection system 40, and vacuum pumping system 45. Substrate 25 can be, for example, a semiconductor substrate, a wafer, or a liquid crystal display (LCD). Processing chamber 10 can be, for example, configured to facilitate the generation of plasma in processing region 5 adjacent a surface of substrate 25. A plasma is formed within processing chamber 10 via collisions between heated electrons and an ionizable gas. An ionizable gas or mixture of gases is introduced via gas injection system 40, and the process pressure is adjusted. Desirably, the plasma is utilized to create materials specific to a predetermined materials process, and to aid either the deposition of material to substrate 25 or the removal of material from the exposed surfaces of substrate 25. Controller 55 can be used to control vacuum pumping system 45 and gas injection system 40.

Substrate 25 can be, for example, transferred into and out of the processing chamber 10 through a slot valve (not shown) and chamber feed-through (not shown) via robotic substrate transfer system where the substrate 25 is received by substrate lift pins (not shown) housed within substrate holder 20 and mechanically translated by devices housed therein. Once substrate 25 is received from substrate transfer system, substrate 25 can be placed on an upper surface of substrate holder 20.

For example, substrate 25 can be affixed to the substrate holder 20 via an electrostatic clamping system 28. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, a gas (e.g., He or $H_2$ gas) can be delivered to the back-side of the substrate via a backside gas system 26 to improve the gas-gap thermal conductance between substrate 25 and substrate holder 20. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers can be included.

As shown in FIG. 2, substrate holder 20 includes an electrode through which RF power is coupled to plasma in processing region 5. For example, substrate holder 20 can be electrically biased at an RF voltage via the transmission of RF power from RF generator 30 through impedance match network 32 to substrate holder 20. The RF bias can serve to heat electrons to form and maintain the plasma. In one configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, impedance match network 32 serves to maximize the transfer of RF power to plasma in processing chamber 10 by minimizing reflected power. Various match network topologies (e.g., L-type, π-type, T-type, etc.) and automatic control methods can be utilized.

With continuing reference to FIG. 2, a process gas can be, for example, introduced to processing region 5 through gas injection system 40. Process gas can, for example, include a mixture of gases such as argon, $CF_4$, and $O_2$, or argon, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$. Gas injection system 40 includes a showerhead where a process gas is supplied from a gas delivery system (not shown) to the processing region 5 through for example a gas injection plenum (not shown), a series of baffle plates (not shown), and a multi-orifice showerhead gas injection plate (not shown).

Vacuum pump system 45 can, for example, include a turbo-molecular vacuum pump (TMP) capable of a pumping speed up to 5000 liters per second (and greater) and a gate valve for throttling the chamber pressure. In conventional dry plasma etch process, a 1000 to 3000 liter per second TMP is generally employed. Furthermore, a device for monitoring chamber pressure (not shown) is coupled to the process chamber 10. The pressure measuring device can be, for example, a Type 628B Baratron absolute capacitance manometer commercially available from MKS Instruments, Inc. (Andover, Mass.).

Additionally, semiconductor manufacturing system 1 can include a plurality of sensors coupled to processing chamber 10 to measure data and controller 55 can be coupled to the sensors to receive the data. The sensors can include both sensors that are intrinsic to the processing chamber 10 and sensors that are extrinsic to the processing chamber 10. Sensors intrinsic to processing chamber 10 include those sensors pertaining to the functionality of processing chamber 10 such as for example the measurement of the Helium backside gas pressure, helium backside flow, electrostatic clamping (ESC) voltage, ESC current, substrate holder 20 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., $C_1$ and $C_2$ positions), a focus ring thickness, RF hours, focus ring RF hours, and any statistic thereof. Sensors extrinsic to processing chamber 10 include those sensors not directly related to the functionality of processing chamber 10 such as for example a light detection device 34 for monitoring the light emitted from the plasma in processing region 5 as shown in FIG. 2, or an electrical measurement device 36 for monitoring the electrical system of processing chamber 10 as shown in FIG. 2.

The light detection device 34 can include a detector such as a (silicon) photodiode or a photomultiplier tube (PMT) for measuring the total light intensity emitted from the plasma. The light detection device 34 can further include an optical filter such as a narrow-band interference filter. In an alternate embodiment, the light detection device 34 includes a line CCD (charge coupled device) or CID (charge injection device) array and a light dispersing device such as a grating or a prism. Additionally, light detection device 34 can include a monochromator (e.g., grating/detector system) for measuring light at a given wavelength, or a spectrometer (e.g., with a rotating grating) for measuring the light spectrum such as, for example, the device described in U.S. Pat. No. 5,888,337, the entire contents of which are incorporated by reference.

The light detection device 34 can include a high resolution optical emission spectrometer (OES) sensor from Peak Sensor Systems. Such an OES sensor has a broad spectrum that spans the ultraviolet (UV), visible (VIS), and near infrared (NIR) light spectrums. The resolution is approximately 1.4 Angstroms, that is, the sensor is capable of collecting 5550 wavelengths from 240 to 1000 nm. The sensor is equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

The electrical measurement device 36 can include, for example, a current and/or voltage probe, a power meter, or spectrum analyzer. For example, plasma processing systems often employ RF power to form plasma, in which case, an RF transmission line, such as a coaxial cable or structure, is employed to couple RF energy to the plasma through an electrical coupling element (i.e., inductive coil, electrode, etc.). Electrical measurements using, for example, a current-voltage probe, can be exercised anywhere within the electrical (RF) circuit, such as within an RF transmission line. Furthermore, the measurement of an electrical signal, such as a time trace of voltage or current, permits the transformation of the signal into frequency space using discrete Fourier series representation (assuming a periodic signal). Thereafter, the Fourier spectrum (or for a time varying signal, the frequency spectrum) can be monitored and analyzed to characterize the state of semiconductor manufacturing system 1. A voltage-current probe can be, for example, a device as described in detail in pending U.S. application Ser. No. 60/259,862 filed on Jan. 8, 2001, and U.S. Pat. No. 5,467,013, the entire contents of which is incorporated herein by reference.

In alternate embodiments, electrical measurement device 36 can include a broadband RF antenna useful for measuring a radiated RF field external to semiconductor manufacturing system 1. One broadband antenna suitable for the present invention is the commercially available broadband RF antenna, Antenna Research Model RAM-220 (0.1 MHz to 300 MHz).

In general, the plurality of sensors can include any number of sensors, intrinsic and extrinsic, which can be coupled to processing chamber 10 to provide tool data to the controller 55.

Controller 55 includes a microprocessor, memory, and a digital I/O port (potentially including D/A and/or A/D converters) configured to generate control voltages sufficient to communicate and activate inputs to the semiconductor manufacturing system 1 as well as monitor outputs from semiconductor manufacturing system 1. As shown in FIG. 2, process tool controller 55 can be coupled to and exchange information with RF generator 30, impedance match network 32, gas injection system 40, vacuum pump system 45, backside gas delivery system 26, electrostatic clamping system 28, light detection device 34, and electrical measurement device 36. A program stored in the memory is utilized to interact with the aforementioned components of a semiconductor manufacturing system 1 according to a stored process recipe. One example of controller 55 is a DELL PRECISION WORKSTATION 530™, available from Dell Corporation, Austin, Tex. Controller 55 can be locally located relative to the semiconductor manufacturing system 1, or controller 55 can be remotely located relative to the semiconductor manufacturing system 1. For example, controller 55 can exchange data with semiconductor manufacturing system 1 using at least one of a direct connection, an intranet, and the internet. Controller 55 can be coupled to an intranet at, for example, a customer site (i.e., a device maker, etc.), or controller 55 can be coupled to an intranet at, for example, a vendor site (i.e., an equipment manufacturer). Additionally, for example, controller 55 can be coupled to the Internet. Furthermore, another computer (i.e., controller, server, etc.) can, for example, access controller 55 to exchange data via at least one of a direct connection, an intranet, and the internet.

Figure 3:
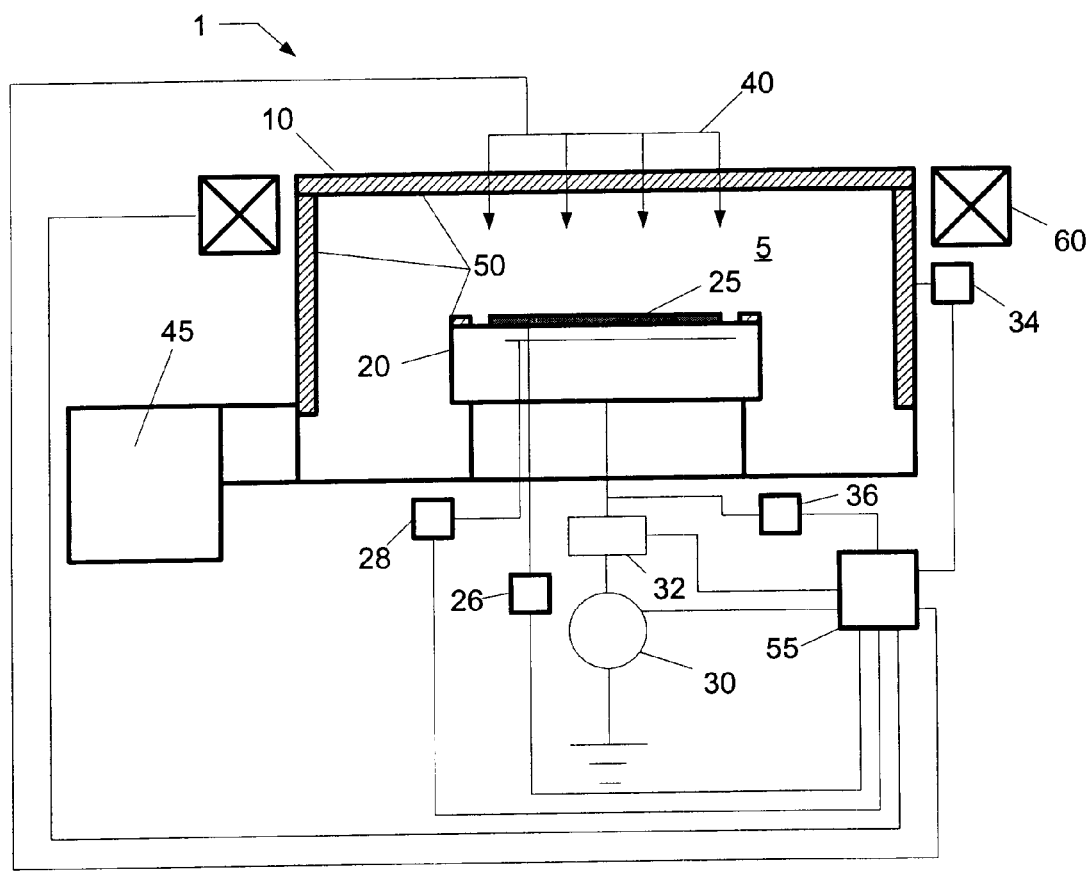
FIG. 3 is a schematic depicting a semiconductor manufacturing system according to another embodiment of the present invention.

As shown in FIG. 3, semiconductor manufacturing system 1 can include a magnetic field system 60. For example, the magnetic field system 60 can be a stationary, or either a mechanically or electrically rotating DC magnetic field in order to potentially increase plasma density and/or improve material processing uniformity. Moreover, controller 55 can be coupled to magnetic field system 60 in order to regulate the field strength or speed of rotation.

Figure 4:
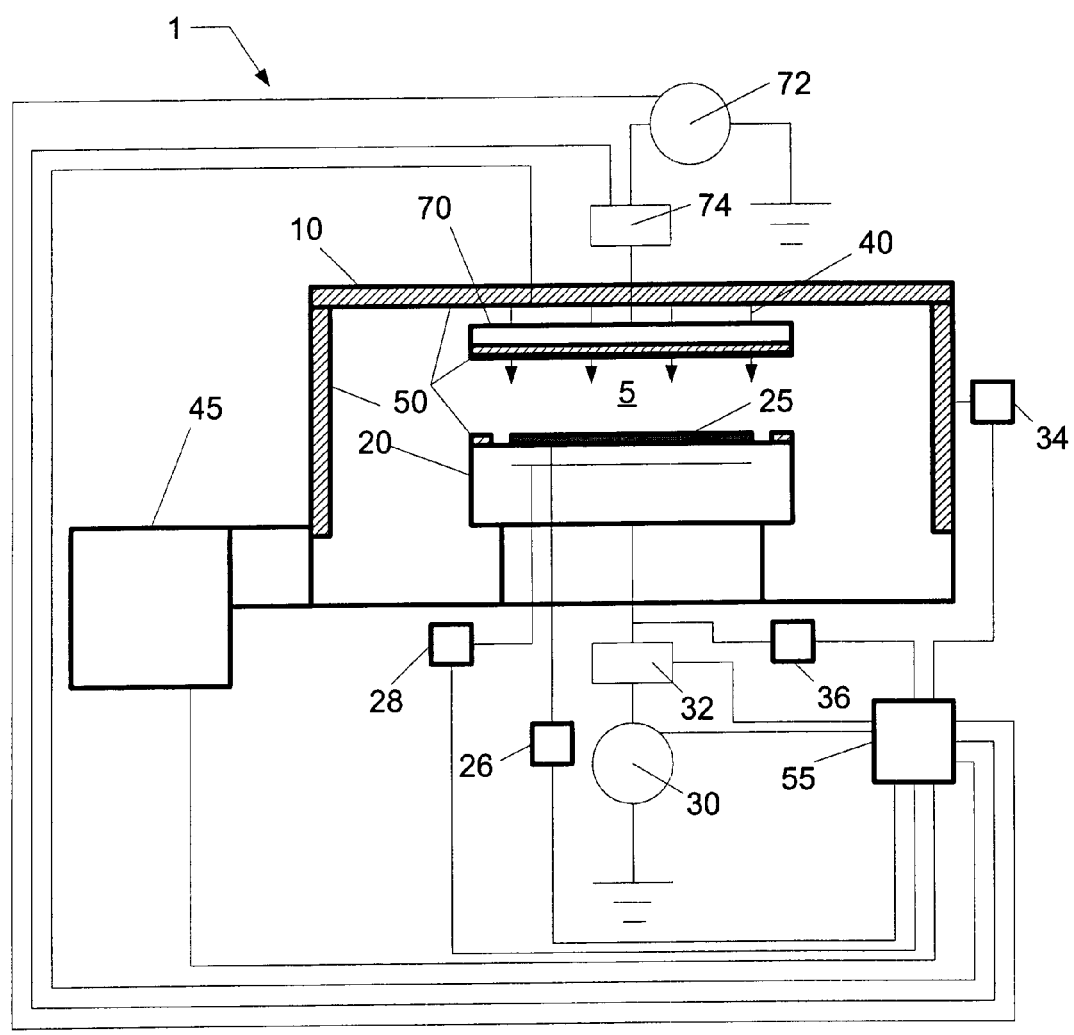
FIG. 4 is a schematic depicting a semiconductor manufacturing system according to a further embodiment of the present invention.

As shown in FIG. 4, the semiconductor manufacturing system 1 can include an upper electrode 70. For example, RF power can be coupled from RF generator 72 through impedance match network 74 to upper electrode 70. A frequency for the application of RF power to the upper electrode preferably ranges from 10 MHz to 200 MHz and is preferably 60 MHz. Additionally, a frequency for the application of power to the lower electrode can range from 0.1 MHz to 30 MHz and is preferably 2 MHz. Moreover, controller 55 can be coupled to RF generator 72 and impedance match network 74 in order to control the application of RF power to upper electrode 70.

Figure 5:
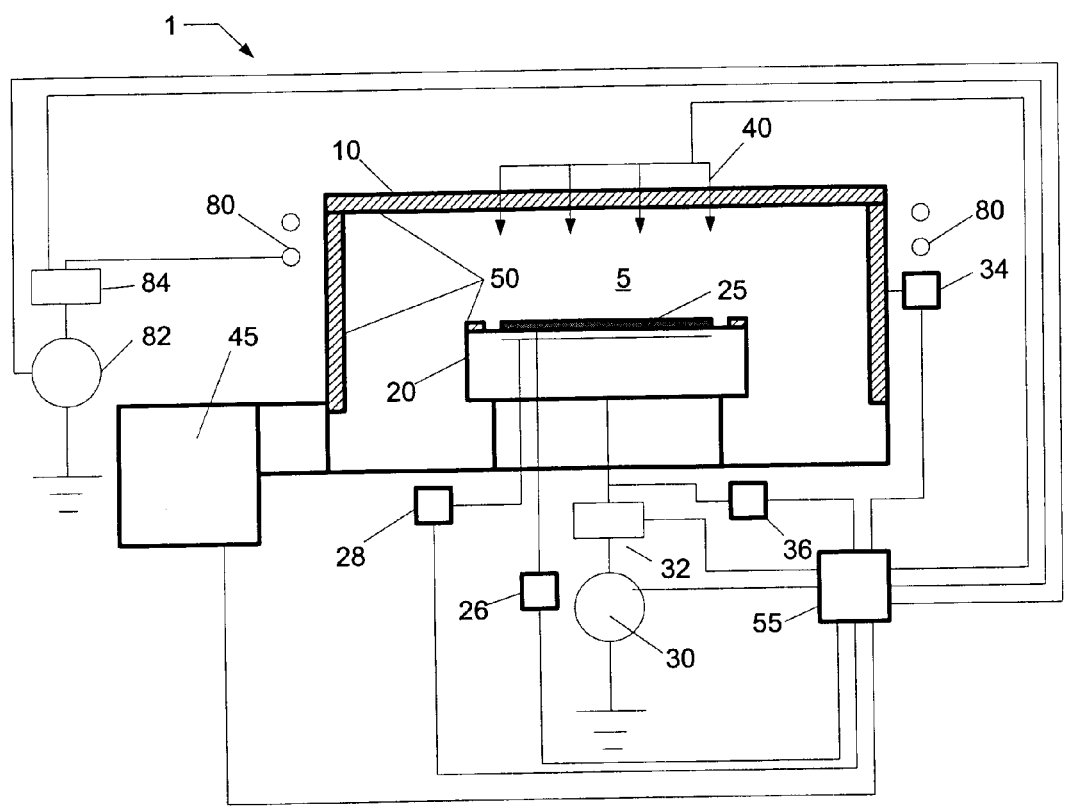
FIG. 5 is a schematic depicting a semiconductor manufacturing system according to one embodiment of the present invention.

As shown in FIG. 5, the semiconductor manufacturing system 1 of FIG. 1 can include an inductive coil 80. For example, RF power can be coupled from RF generator 82 through impedance match network 84 to inductive coil 80, and RF power can be inductively coupled from inductive coil 80 through dielectric window (not shown) to plasma processing region 45. A frequency for the application of RF power to the inductive coil 80 preferably ranges from 10 MHz to 100 MHz and is preferably 13.56 MHz. Similarly, a frequency for the application of power to the substrate holder 20 preferably ranges from 0.1 MHz to 30 MHz and is preferably 13.56 MHz. In addition, a slotted Faraday shield (not shown) can be employed to reduce capacitive coupling between the inductive coil 80 and plasma. Moreover, controller 55 can be coupled to RF generator 82 and impedance match network 84 in order to control the application of power to inductive coil 80. In an alternate embodiment, inductive coil 80 can be a "spiral" coil or "pancake" coil in communication with the plasma processing region 45 from above as in a transformer coupled plasma (TCP) reactor.

Alternately, the plasma can be formed using electron cyclotron resonance (ECR). In yet another embodiment, the plasma is formed from the launching of a Helicon wave. In yet another embodiment, the plasma is formed from a propagating surface wave.

Figure 6A:
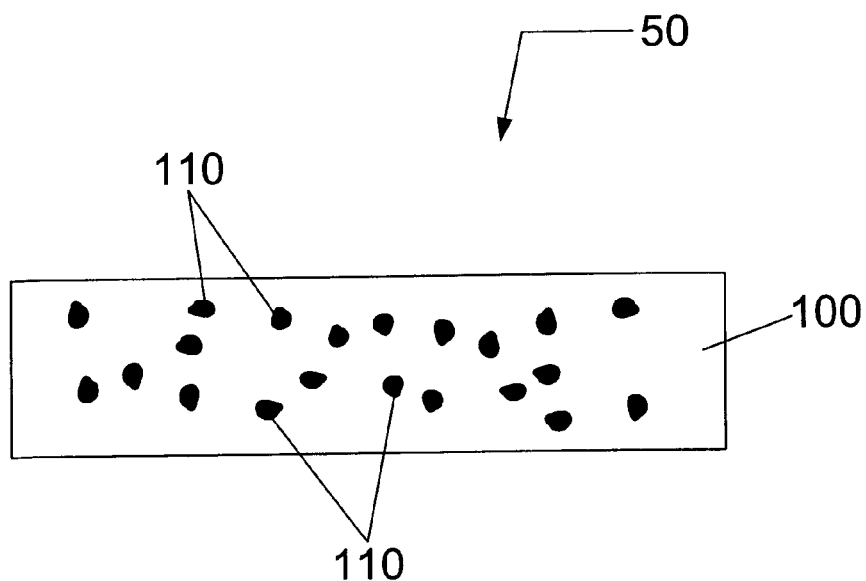
FIG. 6A is a cross-sectional view of a processing element according to one embodiment of the present invention.
Figure 6B:
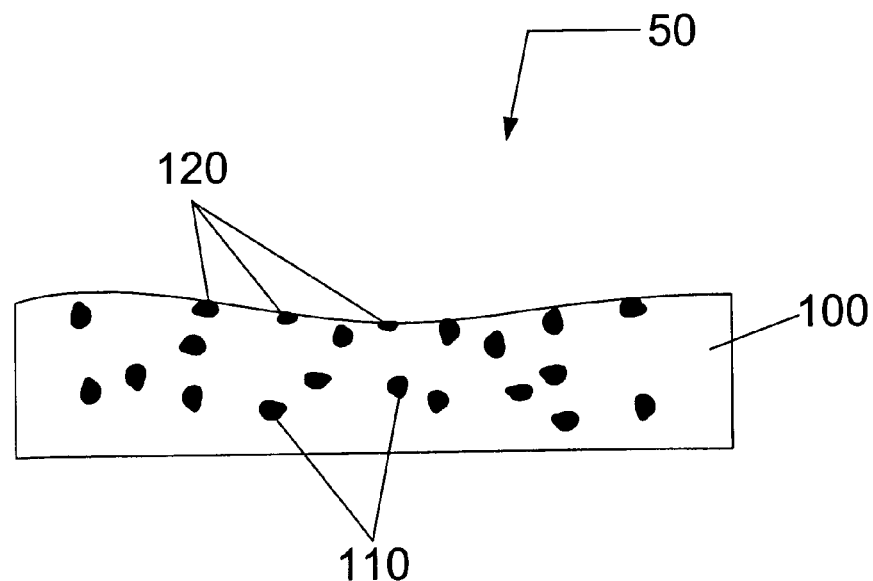
FIG. 6B is a cross-sectional view of an eroded processing element such as that depicted in FIG. 6A.

Referring now to FIG. 6A, a cross-sectional view of processing element 50 is illustrated. Processing element 50 includes a passive component 100 and an active component 110. For example, the passive component 100 can be an inert binding medium that is designed to bind, or embed, the active component 110. As processing element 50 erodes in time as illustrated in FIG. 6B, the active component 110 can become exposed to the chemical process, such as a plasma, and hence becomes active in the chemical composition of the chemical process of for example the plasma.

The passive component 100 includes in one embodiment of the present invention a binding medium that may, for example, include a solid such as a polymer, a porous polymer, or a foam, or it may, for example, include a non-Newtonian fluid such as a gel. The active component 110 can be a material either in solid form, such as a powder or small particles, or in liquid form. In one example, when the active component 110 includes small particles, the passive component 100 can be a polymer. The small particles may be dispersed within a polymer such as KAPTON, polyimide, ultem, amorphous carbon, TEFLON, Peek, thermoplastic polymer, thermoset polymer, or sol-gel, ceramic, or glass. For example, U.S. Pat. No. 4,997,862, the entire contents of which are incorporated by reference, describes a process for preparing a mixture of colloidal particles in a resin matrix. Alternatively, in another example, when the active component 110 is a liquid additive, the passive component 100 can be a porous polymer, or a foam. For example, U.S. Pat. No. 6,436,426, the entire contents of which are incorporated by reference, describes a process for producing porous polymer materials. The active component 110 being in this embodiment of the present invention injected into the pores of the passive component 100.

Thus, an embodiment of the present invention provides a mechanism for inexpensive and effective delivery of solid or liquid active material to a chemical process performed in a process chamber. Moreover, an embodiment of the present invention provides a way of utilizing the widely perceived problem of erosion of chamber components to actually enhance a chemical process performed in the process chamber.

Further, in one embodiment, the active component 110 includes organo-metallic compounds, such as those compounds formed using yttrium, aluminum, iron, titanium, zirconium, and hafnium, and mixtures thereof. Some non-limiting examples of specific organo-metallic compounds for use in the present invention are yttrium tris hexafluoroacetylacetonate, yttrium tris(2,2,6,6-hexamethyl)-3,5-heptanedionate, yttrium tris diphenylacetylacetonate, 1,2-diferrocenylethane, aluminum tris(2,2,6,6-tetramethyl)-3-5-heptanedionate, aluminum lactate, aluminum-8-hydroxyquinoline, bis(cyclopentadienyl)titanium pentasulfide, bis(pentamethylcyclopentadienyl) hafnium dichloride, zirconium acetylacetonate, zirconium tetra(2,26, 6-tetramethyl)-3,5-pentanedionate, zirconium tetra(1,5-diphenylpentane-2-4-dione), ferrocene aldehyde, ferrocene methanol, ferrocene ethanol, ferrocene carboxylic acid, ferrocene dicarboxylic acid, 1,2 diferrocene ethane, 1,3 diferrocene propane, 1,4 diferrocene butane and decamethylferrocene. According to an embodiment of the present invention the addition of organo-metallic compounds as the active component 110 leads to greater etch resistance for a photoresist. Additionally, these additives can alter loading effects of the plasma, and subsequent deposition reactions, and can improve a center-to-edge uniformity and an aspect ratio dependent etching (i.e., an isolated-to-nested array structure uniformity).

In another embodiment, the active component 110 includes ultraviolet (UV) absorbers and stabilizers, such as benzophenone, benzotriazole, and hindered amine stabilizers (HALS). According to an embodiment of the present invention, the addition of UV absorbers/stabilizers as active component 110 can lead to reduced bond-breaking in photoresist during plasma etching and, therefore, less photoresist damage and greater etch resistance. Additionally, these additives can be used to alter loading effects of the plasma, and subsequent deposition reactions, and can improve a center-to-edge uniformity and an aspect ratio dependent etching (i.e., an isolated-to-nested array structure uniformity).

In another embodiment, the active component 110 includes antioxidants, such as hindered phenols, aromatic amines, organophosphorous compounds, thiosynergists, hydroxylamine, lactones, and acrylated bis-phenols. According to an embodiment of the present invention, the addition of antioxidants can tie up free radicals, thereby leading to more deposition and different bonding structures within a deposition chemistry, leading to less photoresist damage, greater etch resistance, and increased selectivity. Additionally, these additives can be used to alter loading effects of the plasma, and subsequent deposition reactions, and can improve a center-to-edge uniformity and an aspect ratio dependent etching such as an isolated-to-nested array structure uniformity. For example, isolated versus nested array structure suggests the spacing between structures (or pitch), wherein for isolated structures the spacing is large, and for nested structures, the spacing is small.

In order to control the rate at which the active component 110 is exposed to the processing plasma, at least one of a process gas, a processing element temperature, a geometry of the processing element, a size of the active component, a concentration of the active component, or a distribution of the active component is adjusted, according to an embodiment of the present invention. For example, the size of the chamber component and the orientation of the active component coupled thereto may be configured in consideration of a known erosion rate of the chamber component in a particular chamber chemical process. As would be appreciated by one of ordinary skill in the art, different configurations of the chamber component may be used in consideration of factors such as the active component composition, the process in the chamber, the composition of the passive matrix, etc.

As another example of controlling the rate of the active component, a process gas can include an etch gas having one or more constituents, any of which can be adjusted by introduction of an active component to affect the chemistry of the chemical process and, in turn affect the interaction between the chemistry and the active component 110. For instance, when etching oxide dielectric films such as silicon oxide, silicon dioxide, etc., or when etching inorganic low-k dielectric films such as oxidized organosilanes, the etch gas composition generally includes a fluorocarbon-based chemistry such as at least one of $C_4F_8$, $C_5F_8$, $C_3F_6$, $C_4F_6$, $CF_4$, etc., and at least one of an inert gas, oxygen, and CO. According to an embodiment of the present invention, the above-noted organo-metallic compounds can be encapsulated in the above-noted passive porous polymer matrix, e.g. Teflon. Upon heating the passive matrix, the organo-metallic compounds are expected to be released to the plasma process due to the accelerated consumption of the passive component, hence, affecting for example the electron-energy, electron distribution, and thus uniformity of the dielectric etching process.

Alternatively, for example, when etching organic low-k dielectric films such as SiLK-I, SiLK-J, SiLK-H, SiLK-D, and porous SiLK semiconductor dielectric resins commercially available from Dow Chemical, and FLARE™ and Nano-glass commercially available from Honeywell, the etch gas composition generally includes at least one of a nitrogen-containing gas, and a hydrogen-containing gas. Alternatively, for instance, when etching silicon, the etch gas composition generally includes at least one of a fluorine containing gas such as $NF_3$, $SiF_4$, or $SF_6$, HBr, and $O_2$. As before, the encapsulation of an organo-metallic compound in for example a porous polymer are expected to upon for example heating introduce the organo-metallic compounds into the plasma etching process and improve uniformity.

Indeed, the temperature of the processing element can be varied to affect the rate at which the active component 110 is introduced into the plasma chemistry. The processing element can be heated passively, due to its contact with the chemical process, or the processing element can be heated actively by a voltage-controlled heating element disposed in the processing chamber proximate the processing element. For instance, the heating element can be a resistive heating element such as a tungsten, nickel-chromium alloy, aluminum-iron alloy, aluminum nitride, etc., filament. Examples of commercially available materials to fabricate resistive heating elements include KANTHAL, NIKROTHAL, AKROTHAL, which are registered trademark names for metal alloys produced by KANTHAL Corporation of Bethel, Conn. The KANTHAL family includes ferritic alloys (Fe-CrAl) and the NIKROTHAL family includes austenitic alloys (NiCr, NiCrFe). When an electrical current flows through the filament, power is dissipated as heat. Hence, the use of a temperature control unit, coupled to the heating element in the processing chamber, can adjust or control the temperature of the processing element and thus control a rate of delivery of the active material to the chemical process. In one example, the temperature control unit can include a controllable DC power supply such as a Firerod cartridge heater commercially available from Watlow (1310 Kingsland Dr., Batavia, Ill., 60510).

Figure 7A:
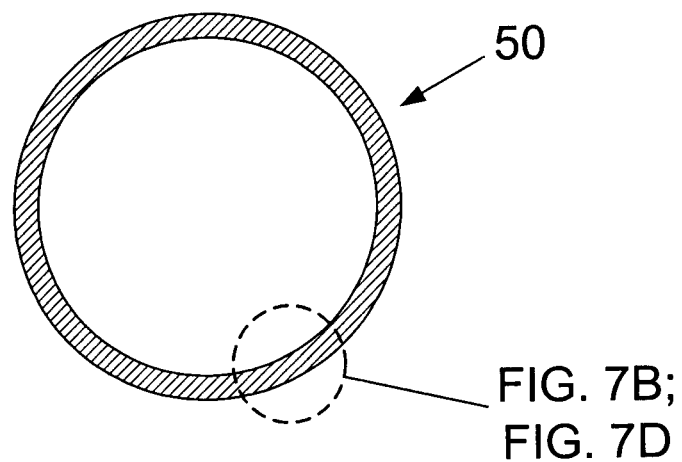
FIG. 7A is a cross-sectional view of a cylindrical processing element according to one embodiment of the present invention.
Figure 7B:
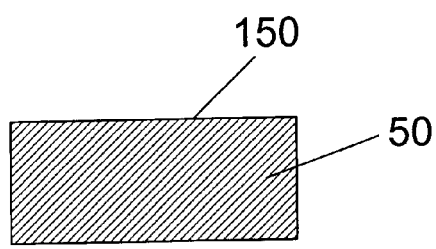
FIG. 7B is an exploded view of an inner surface of a processing element of the present invention.
Figure 7C:
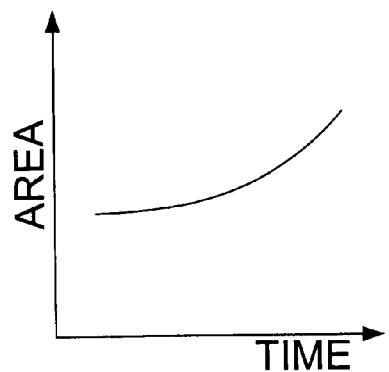
FIG. 7C is a schematic illustrating the temporal variation of the surface area of the inner surface of the processing element depicted in FIG. 7B during erosion.
Figure 7D:
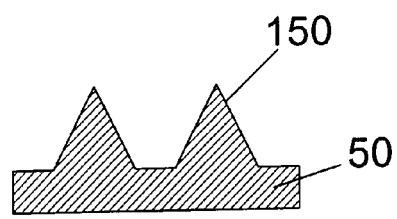
FIG. 7D is an exploded view of an inner surface of yet another processing element of the present invention.
Figure 7E:
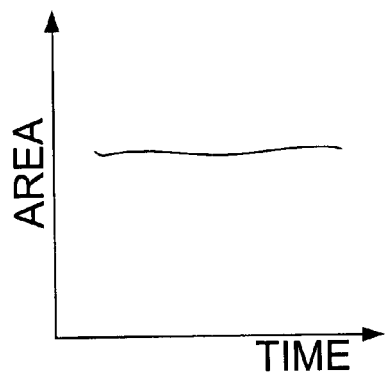
FIG. 7E is a schematic illustrating a temporal variation of the surface area of the inner surface of the processing element depicted in FIG. 7D during erosion.

Alternately, for example, the cross-sectional geometry of the processing element can be varied in order to affect the amount of surface area exposed to the processing plasma as a function of time. FIG. 7A shows a cross-sectional view of processing element 50, wherein FIG. 7B and FIG. 7D present two alternatives for the geometrical shape of the exposed surface 150. In FIG. 7B, the exposed surface 50 is the cylindrical inner surface of processing element 50 as depicted in FIG. 7A. As the processing element erodes radially outward, the exposed surface area increases with time (by redial erosion outwards) as shown in FIG. 7C. Alternatively, in FIG. 7D, the exposed surface 150 includes a groove structure formed on the cylindrical inner surface of processing element 50 in FIG. 7A. As the processing element 50 erodes radially outward, the exposed surface area remains substantially constant with time (or erosion) as shown in FIG. 7E.

In one embodiment of the present invention, at least one of the size (pore size or particle size) of the active component and the concentration of the active component (pores or particles) are varied spatially throughout the processing element in order to affect the amount the active component 110 is exposed to the processing plasma in time. Further, in one embodiment of the present invention, the distribution of the active component (pores or particles) can vary spatially throughout the processing element in order to affect the amount the active component 110 is exposed to the processing plasma in time. For example, as the processing element erodes, the concentration of the active component 110 can increase, decrease, or remain constant in order to counter the effects of a drifting process between cleaning/maintenance intervals within the processing chamber.

Figure 8:
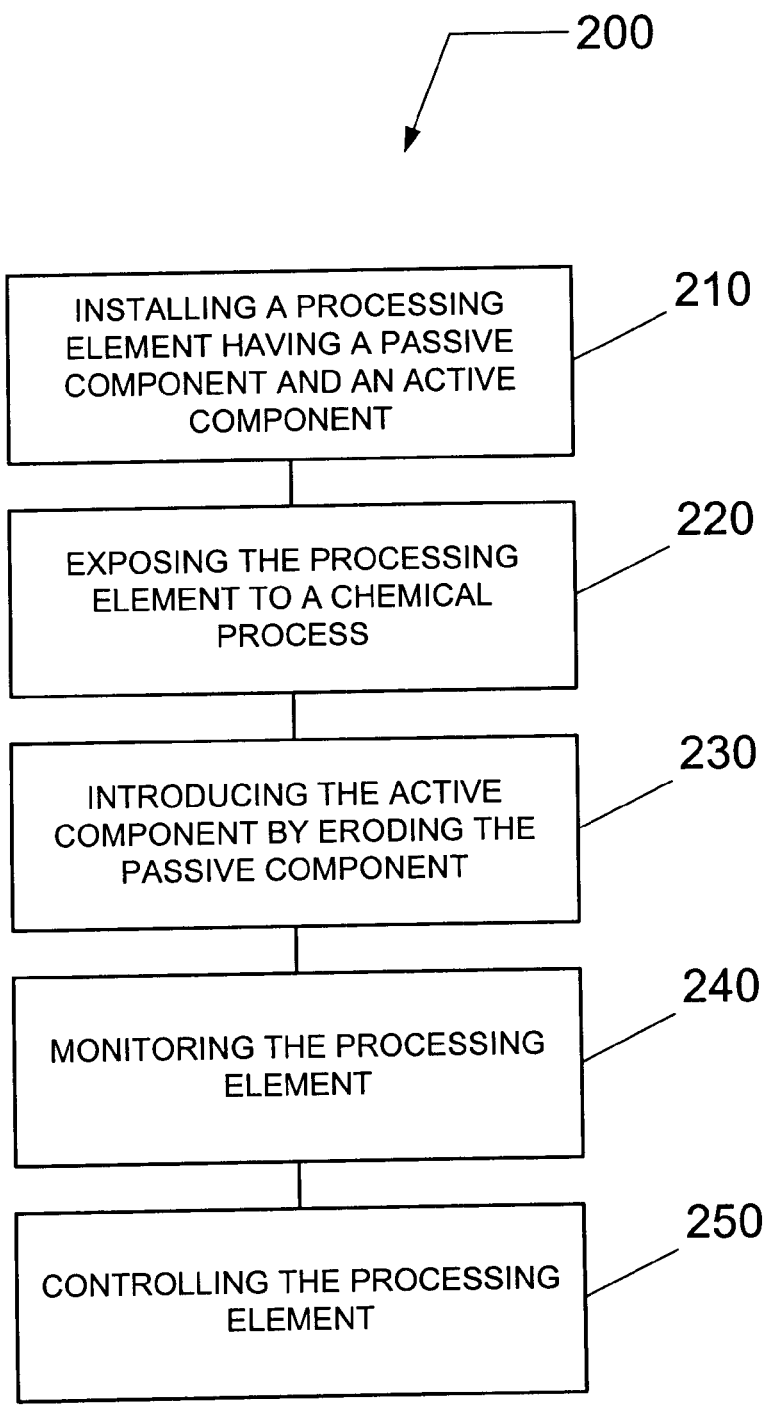
FIG. 8 depicts a method of utilizing a processing element to affect a chemical process in a semiconductor manufacturing system according to one embodiment of the present invention.

Accordingly, in one method according to an embodiment of the present invention, a processing element is utilized to affect a chemical process in a semiconductor manufacturing system is described. This method follows the steps depicted in FIG. 8 by flowchart 200, beginning in step 210, with providing a processing element in a semiconductor manufacturing system. As described above, the processing element includes a passive component configured to erode when the active component is exposed to the chemical process in the semiconductor manufacturing system, and includes an active component coupled to the passive component and configured to alter the chemistry of the chemical process when the active component is exposed to the chemical process. The passive component includes a material that when introduced to the chemical process is inert. For example, the passive component can be a polymer, a porous polymer, a foam, or a gel. The active component includes a material that when introduced to the chemical process, alters the chemistry of the process to the extent that the processing of a substrate is affected. For example, the active component can be an organo-metallic compound, an ultraviolet (UV) absorber, or an antioxidant to affect photoresist patterning and development on a substrate.

In step 220, the processing element is exposed to the chemical process in the semiconductor manufacturing system. The semiconductor manufacturing system can be any one of the processing systems described in FIGS. 1 through 5. Therein, the processing element can be coupled to at least one of the processing chamber, the gas distribution system, substrate holder, or the plasma source. For example, in a dry plasma etch system, the chemical process is initiated by introducing a process gas within the processing chamber, and igniting a plasma using the plasma source. Thereafter, the chemical process proceeds, and interacts with the exposed processing element.

In step 230, the active component is introduced to the chemical process as the passive component erodes in the presence of the chemical process.

Optionally, in step 240, the method monitors the processing element in order to determine the effectiveness of the introduction of the active component to the chemical process. For example, during plasma processing, the processing element can be monitored by measuring the intensity of light emitted from the processing chamber, wherein changes in the light intensity can correspond to changes in the introduction of the active component to the chemical process. Moreover, the spectrum of light across a pre-determined spectral range can be monitored using optical emission spectroscopy (OES), such as the system described above, to detect changes corresponding to the introduction of the active component. Monitoring light emission and using the light emission for detecting changes in a plasma process are well known to those skilled in the art optical diagnostics for plasma monitoring.

Optionally, for example, the processing element can be monitored by measuring a thickness of the processing element and detecting a change in the thickness as the chemical process proceeds. The thickness can be measured using an ultrasonic sensor, such as that described in U.S. Pat. No. 6,019,000 (Stanke et al.; Sensys Instruments Corporation, The Board of Trustees of the Leland Stanford Junior University), the entire contents of which is incorporated herein by reference.

Optionally, during plasma processing, the processing element can be monitored by measuring a voltage (or current) at a point within the electrical system using a voltage-current probe, such as the system described above. The voltage (or current) can be measured within the transmission line extending from an impedance match network to the respective electrode through which RF power is coupled to the processing plasma (see FIGS. 2 through 5). Since the processing element exists as part of the overall electrical system, due in part to its electrical connection to the processing plasma, a change in the processing element (i.e., due to erosion) translates into a change in the electrical impedance for the electrical system, and can be detected as a change in the voltage (or current), or a harmonic thereof of the applied voltage, if the RF power is maintained a constant (via the RF generator and impedance match network).

Optionally, in step 250, the method controls the rate at which the active component is introduced to the chemical process. At least one of a process gas, a processing element temperature, a geometry of the processing element, a size of the active component, a concentration of the active component, or a distribution of the active component determines the rate of introduction of the active component. For example, after the monitoring system detects a first level of active component introduced to the chemical process, then the rate of introduction of the active component can be increased or decreased to achieve a second level of active component introduced to the chemical process by increasing or decreasing the temperature of the processing element, respectively.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Hence, numerous modifications and variations of the present invention are possible in light of the above teachings. It is therefore to be understood that within the scope of the appended claims, the invention may be practiced otherwise than as specifically described herein.

The invention claimed is:

1. A processing element for a semiconductor manufacturing system, said processing element comprising:
   a cylindrical unit including a passive polymeric component and an active component;
   said cylindrical unit having a first radially-extending surface and a second radially extending surface opposite the first radially-extending surface,
   wherein an inside diameter of the cylindrical unit forms an opening for disposition of the cylindrical unit around a substrate position in the semiconductor manufacturing system and the second radially extending surface is a substantially planar surface for disposition on a substrate holder in the semiconductor manufacturing system;
   said passive polymeric component configured to erode when exposed to a plasma process in said semiconductor manufacturing system; and
   said active component including a liquid component embedded within a part of said passive component and configured to alter the chemistry of the processing when exposed to the plasma process.

2. The processing element as recited in claim 1, wherein said active component comprises an organo-metallic compound.

3. The processing element as recited in claim 2, wherein said organo-metallic compound comprises at least one of yttrium, aluminum, iron, titanium, zirconium, and hafnium.

4. The processing element as recited in claim 2, wherein said organo-metallic compound comprises at least one of yttrium tris hexafluoroacetylacetonate, yttrium tris(2,2,6,6-hexamethyl)-3,5-heptanedionate, yttrium tris diphenylacetylacetonate, 1,2-diferrocenylethane, aluminum tris(2,2,6,6-tetramethyl)-3-5-heptanedionate, aluminum lactate, aluminum-8-hydroxyquinoline, bis(cyclopentadienyl)titanium pentasulfide, bis(pentamethylcyclopentadienyl) hafnium dichloride, zirconium acetylacetonate, zirconium tetra(2,26,6-tetramethyl)-3,5-pentanedionate, zirconium tetra(1,5-diphenylpentane-2-4-dione), ferrocene aldehyde, ferrocene methanol, ferrocene ethanol, ferrocene carboxylic acid, ferrocene dicarboxylic acid, 1,2 diferrocene ethane, 1,3 diferrocene propane, 1,4 diferrocene butane and decamethylferrocene.

5. The processing element as recited in claim 1, wherein said active component comprises an ultraviolet (UV) absorber.

6. The processing element as recited in claim 5, wherein said UV absorber comprises at least one of benzophenone, benzotriazole, and hindered amine stabilizers (HALS).

7. The processing element as recited in claim 1, wherein said active component comprises an antioxidant.

8. The processing element as recited in claim 7, wherein said antioxidant comprises at least one of hindered phenols, aromatic amines, organophosphorous compounds, thiosynergists, hydroxylamine, lactones, and acrylated bis-phenols.

9. The processing element as recited in claim 1, wherein said active component further comprises a distribution of solid particles encapsulated within said passive component.

10. The processing element as recited in claim 9, wherein said distribution of solid particles within said passive component comprises variations in at least one of a particle size, a particle composition, and a particle concentration.

11. The processing element as recited in claim 1, wherein said processing element is configured to be temperature controlled in order to alter a rate at which said active component is exposed to said plasma process.

12. The processing element as recited in claim 1, wherein said processing element is configured geometrically to affect a rate at which said active component is exposed to said plasma process.

13. The processing element as recited in claim 1, wherein said processing element is cylindrical, and an inner surface of said processing element comprises,
   a groove structure formed thereon and configured to expose a substantially constant surface area of said inner surface as said inner surface recedes during erosion by said plasma process.

14. The processing element as recited in claim 1, wherein said passive component comprises at least one of a polymer, a porous polymer, a foam, and a gel.

15. The processing element as recited in claim 14, wherein said polymer comprises a polyimide.

16. A semiconductor manufacturing system for processing a substrate using a plasma process, comprising:
   a processing chamber configured to facilitate said plasma process;
   a substrate holder coupled to said processing chamber and configured to support said substrate;
   a gas distribution system coupled to said processing chamber and configured to introduce a process gas to said processing chamber;
   a plasma source coupled to said processing chamber and configured to generate a plasma in said processing chamber;
   at least one processing element coupled to at least one of said processing chamber, said substrate holder, said gas distribution system, and said plasma source; and
   said at least one processing element comprising,
   a cylindrical unit including a passive polymeric component and an active component,
   said cylindrical unit having a first radially-extending surface and a second radially extending surface opposite the first radially-extending surface,
   wherein an inside diameter of the cylindrical unit forms an opening for disposition of the cylindrical unit around a substrate position in the semiconductor manufacturing system and the second radially extending surface is a substantially planar surface for disposition on a substrate holder in the semiconductor manufacturing system,
   said passive polymeric component configured to erode when exposed to a plasma process in said semiconductor manufacturing system, and
   said active component including a liquid component embedded within a part of said passive component and configured to alter the chemistry of the processing when exposed to the plasma process.

17. The semiconductor manufacturing system as recited in claim 16, wherein said active component comprises an organo-metallic compound.

18. The semiconductor manufacturing system as recited in claim 17, wherein said organo-metallic compound comprises at least one of yttrium, aluminum, iron, titanium, zirconium, and hafnium.

19. The semiconductor manufacturing system as recited in claim 17, wherein said organo-metallic compound comprises at least one of yttrium tris hexafluoroacetylacetonate, yttrium tris(2,2,6,6-hexamethyl)-3,5-heptanedionate, yttrium tris diphenylacetylacetonate, 1,2-diferrocenylethane, aluminum tris(2,2,6,6-tetramethyl)-3-5-heptanedionate, aluminum lactate, aluminum-8-hydroxyquinoline, bis(cyclopentadienyl) titanium pentasulfide, bis(pentamethylcyclopentadienyl) hafnium dichloride, zirconium acetylacetonate, zirconium tetra(2,26,6-tetramethyl)-3,5-pentanedionate, zirconium tetra(1,5-diphenylpentane-2-4-dione), ferrocene aldehyde, ferrocene methanol, ferrocene ethanol, ferrocene carboxylic acid, ferrocene dicarboxylic acid, 1,2 diferrocene ethane, 1,3 diferrocene propane, 1,4 diferrocene butane and decamethylferrocene.

20. The semiconductor manufacturing system as recited in claim 16, wherein said active component comprises at least one of an organo-metallic compound, an ultraviolet absorber, and an antioxidant.

21. The semiconductor manufacturing system as recited in claim 16, wherein said active component further comprises a distribution of solid particles encapsulated within said passive component.

22. The semiconductor manufacturing system as recited in claim 21, wherein said distribution of solid particles within said passive component comprises varieties in at least one of a particle size, a particle composition, and a particle concentration.

23. The semiconductor manufacturing system as recited in claim 16, wherein said processing element is configured to be temperature controlled in order to alter a rate at which said active component is exposed to said plasma process.

24. The semiconductor manufacturing system as recited in claim 16, wherein said at least one processing element is configured geometrically to affect a rate at which said active component is exposed to said plasma process.

25. The semiconductor manufacturing system as recited in claim 16, wherein said passive component comprises at least one of a polymer, a porous polymer, a foam, and a gel.

* * * * *